US012789487B2

(12) United States Patent
Arai et al.

(10) Patent No.: US 12,789,487 B2
(45) Date of Patent: Nov. 10, 2026

(54) METHOD FOR MANUFACTURING OPTICAL ELEMENT, AND OPTICAL ELEMENT

(71) Applicant: CANON KABUSHIKI KAISHA, Tokyo (JP)

(72) Inventors: Kazuhiro Arai, Kanagawa (JP); Junji Kawasaki, Kanagawa (JP); Kazuhiro Koga, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 18/921,151

(22) Filed: Oct. 21, 2024

(65) Prior Publication Data

US 2025/0135736 A1 May 1, 2025

(30) Foreign Application Priority Data

Nov. 1, 2023 (JP) ................................ 2023-187767

(51) Int. Cl.
*B29D 11/00* (2006.01)
*G02B 1/04* (2006.01)
(Continued)

(52) U.S. Cl.
CPC ........ *B29D 11/00326* (2013.01); *G02B 1/041* (2013.01); *G02B 3/08* (2013.01); *G03F 7/0002* (2013.01); *G03G 15/04045* (2013.01)

(58) Field of Classification Search
CPC ................................................ B29D 11/00326
See application file for complete search history.

(56) References Cited

U.S. PATENT DOCUMENTS

| | | | | |
|---|---|---|---|---|
| 7,473,090 B2 * | 1/2009 | McMackin | B82Y 10/00 425/408 |
| 2006/0177532 A1 * | 8/2006 | Fletcher | G03F 7/0002 425/375 |

(Continued)

FOREIGN PATENT DOCUMENTS

| | | | |
|---|---|---|---|
| JP | 2003026431 A * | 1/2003 | C03B 11/088 |
| JP | 2003-43203 A | 2/2003 | |

(Continued)

OTHER PUBLICATIONS

Machine translation of JP-2003026431-A, retrieved from USPTO database Apr. 15, 2026 (Year: 2026).*

(Continued)

*Primary Examiner* — Timothy Kennedy
(74) *Attorney, Agent, or Firm* — Venable LLP

(57) ABSTRACT

The present disclosure provides a method for manufacturing an optical element having a fine structured surface on which a fine structure is formed, by use of a mold having a fine structure forming surface, includes: forming the optical element by filling the mold with a curable composition, and curing the curable composition; and releasing the optical element from the fine structure forming surface, wherein the fine structure forming surface includes a fine structure forming region and a mold release region; the mold release region is provided on at least a part of an outer edge of the fine structure forming surface; and a surface roughness of the mold release region is smaller than a surface roughness of the fine structure forming region.

14 Claims, 9 Drawing Sheets

(51) Int. Cl.

| | |
|---|---|
| ***G02B 3/08*** | (2006.01) |
| ***G03F 7/00*** | (2006.01) |
| ***G03G 15/04*** | (2006.01) |

(56) References Cited

U.S. PATENT DOCUMENTS

| | | | | | |
|---|---|---|---|---|---|
| 2006/0266916 | A1* | 11/2006 | Miller | B82Y 40/00 | 249/134 |
| 2006/0279004 | A1* | 12/2006 | Suehira | G03F 9/7084 | 257/797 |
| 2007/0031639 | A1* | 2/2007 | Hsu | C23C 8/24 | 428/141 |
| 2007/0176320 | A1* | 8/2007 | Nakamura | B82Y 10/00 | 425/174 |
| 2010/0104984 | A1* | 4/2010 | Shiobara | B82Y 10/00 | 430/319 |
| 2011/0062623 | A1* | 3/2011 | Saito | G03F 7/0002 | 264/219 |
| 2011/0068503 | A1* | 3/2011 | Sato | B29C 33/42 | 264/219 |
| 2016/0067910 | A1* | 3/2016 | Suzuki | G03F 7/0002 | 264/40.5 |

FOREIGN PATENT DOCUMENTS

| | | | | |
|---|---|---|---|---|
| JP | 2003220619 | A | * | 8/2003 |
| JP | 2003222706 | A | * | 8/2003 |
| JP | 2003222708 | A | * | 8/2003 |
| JP | 2003222709 | A | * | 8/2003 |
| JP | 2005081782 | A | * | 3/2005 |
| JP | 2005193646 | A | * | 7/2005 |
| JP | 2020112747 | A | * | 7/2020 |

OTHER PUBLICATIONS

Machine translation of JP-2003220619-A, retrieved from USPTO database Apr. 15, 2026 (Year: 2026).*
Machine translation of JP-2003222708-A, retrieved from USPTO database Apr. 15, 2026 (Year: 2026).*
Machine translation of JP-2003222706-A, retrieved from USPTO database Apr. 15, 2026 (Year: 2026).*
Machine translation of JP-2003222709-A, retrieved from USPTO database Apr. 15, 2026 (Year: 2026).*
Machine translation of JP-2005081782-A, retrieved from USPTO database Apr. 15, 2026 (Year: 2026).*
Machine translation of JP-2005193646-A, retrieved from USPTO database Apr. 15, 2026 (Year: 2026).*
Machine translation of JP-2020112747-A, retrieved from USPTO database Apr. 15, 2026 (Year: 2026).*

* cited by examiner

METHOD FOR MANUFACTURING OPTICAL ELEMENT, AND OPTICAL ELEMENT

BACKGROUND OF THE INVENTION

Field of the Invention

The present disclosure relates to a method for manufacturing an optical element with the use of a mold having a fine structure formed thereon, an optical element, a lens, an image forming apparatus, optical equipment, and an imaging device.

Description of the Related Art

It is known that functions such as antireflection and polarization control can be imparted to an optical substrate by forming a fine structure on the surface of the optical substrate.

As a method for forming the fine structure, there are known methods of: coating a film in which fine particles are dispersed that have a particle diameter of a visible light wavelength or smaller; and forming a pattern with the use of an electron beam drawing apparatus, a laser interference exposure apparatus, a semiconductor exposure apparatus, an etching apparatus or the like. However, in these forming methods, the optical element and the fine structure are separately formed, and this results in increasing the processing cost. Because of this, such a method is proposed (Japanese Patent Application Laid-Open No. 2003-43203) as to form a fine structure on a surface at the same time as molding of an optical element, by using a mold having a fine structure formed on a surface thereof.

In general, a molded article is released from a mold by being pushed by a force larger than a mold release resistance force, with the use of an ejector pin or the like. However, in a method of molding an optical element which uses a mold having a fine structure on the surface thereof, there has been a problem that the fine structure is destroyed by the mold release resistance force, which results in the fine structure being stuck to the surface of the mold. This problem becomes particularly significant when the fine structure is small, or when an aspect ratio is high. An object of the present disclosure is to provide a method for manufacturing an optical element which can prevent or reduce the damage of the fine structure at the time of mold release, by reducing mold release resistance by providing a mold release region from which the molded article is released prior to a fine structure forming region, in at least a part of an outer edge portion of a mold having a fine structure on a surface thereof, and to provide the optical element manufactured by the method.

SUMMARY OF THE INVENTION

The present disclosure provides a method for manufacturing an optical element having a fine structured surface on which a fine structure is formed, by use of a mold having a fine structure forming surface, the method including: forming the optical element by filling the mold with a curable composition, and curing the curable composition; and releasing the optical element from the fine structure forming surface, wherein the fine structure forming surface includes a fine structure forming region and a mold release region; the mold release region is provided on at least a part of an outer edge of the fine structure forming surface; and a surface roughness of the mold release region is smaller than a surface roughness of the fine structure forming region.

Further features of the present invention will become apparent from the following description of exemplary embodiments with reference to the attached drawings.

DESCRIPTION OF THE EMBODIMENTS

Figure 1A:
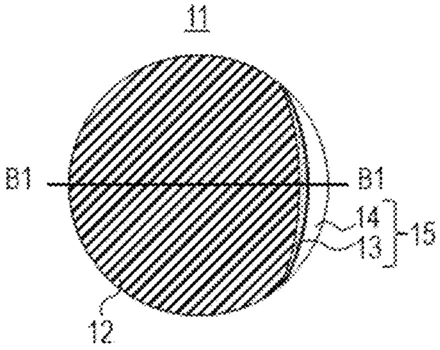
FIG. 1A illustrates a schematic view of a mold used in a first Example of the present disclosure.

Preferred embodiments of the present invention will now be described in detail in accordance with the accompanying drawings.

The present disclosure provides a method for manufacturing an optical element having a fine structured surface on which a fine structure is formed, by use of a mold having a fine structure forming surface, the method including: forming the optical element by filling the mold with a curable composition, and curing the curable composition; and releasing the optical element from the fine structure forming surface, wherein the fine structure forming surface includes a fine structure forming region and a mold release region; the mold release region is provided on at least a part of an outer edge of the fine structure forming surface; and a surface roughness of the mold release region is smaller than a surface roughness of the fine structure forming region.

In such an optical element as to be manufactured in this way, in order to prevent a diffraction phenomenon in a target wavelength band, it is preferable to have a fine structure with a period shorter than the wavelength. Accordingly, an average period of the fine structure of the fine structured surface of the mold is preferably 1000 nm or smaller. In the case where a target of the optical element is visible light, the average period is preferably 400 nm or smaller. In addition, the average period is preferably 100 nm or larger, for manufacturing reasons. In addition, a height of the fine structure (difference between the recessed surface and the protruding surface of the fine structure)/half period is 0.8 or larger and 4 or smaller, from an optical aspect ratio of the optical element.

The mold release region may be formed of a flat region at an outermost edge of the fine structure forming surface and an intermediate region between the flat region and the fine structure forming region. Alternatively, the mold release region may be formed so that the surface roughness gradually increases toward the outer edge of the fine structure forming surface. Alternatively, the mold release region may be formed of only the flat region.

In at least a part of the mold release region, the reference plane can be made lower than the surface of the recessed portion of the fine structure forming region. For information, the reference plane is an average value of a height of the plane, and when the plane is uneven, the reference plane can be an average height of a protruding portion and a recessed portion of the plane. In particular, when the mold release region is formed of only a flat region, the effect can be obtained by making the reference plane of the mold release region lower than the surface of the recessed portion of the fine structure forming region. When h shall represent a difference between the reference plane of the mold release region and the surface of the recessed portion of the fine structure forming region, and d shall represent the height of the fine structure (the difference between the recessed surface and the protruding surface of the fine structure), $10\% \leq h/d \leq 350\%$ can be satisfied. In addition, $100\ \mathrm{nm} \leq h \leq 2500\ \mathrm{nm}$ can be satisfied.

The surface roughness is an average value of distances from a reference plane which is an average value of irregularities of the surface. In the case where the intermediate region is provided, when the surface roughness of the flat region is represented by R0, the surface roughness of the intermediate region is represented by R1, and the surface roughness of the fine structure is represented by R2, R0<R1<R2 is preferably satisfied. In addition, R2−R1≥10 nm can be satisfied. In addition, R0<10 nm and 10 nm≤R1 can be satisfied.

Figure 8:
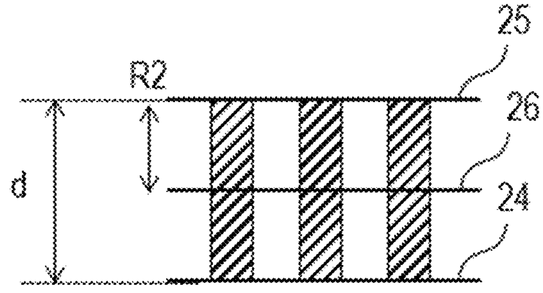
FIG. 8 illustrates a schematic view describing a surface roughness of a fine structure.

As for the fine structured surface, when the fine structure is a periodic structure, as illustrated in FIG. 8, a reference plane 26 of the fine structure is middle between a surface of a protruding portion 25 and a surface of a recessed portion 24. The surface roughness is an average value of the distances from the reference plane, and accordingly, the surface roughness R2 of the fine structure becomes half the height d of the fine structure. The height d of the fine structure is preferably 40 nm or larger and 2000 nm or smaller, and accordingly, R2 is preferably 20 nm or larger and 1000 nm or smaller.

Figure 9A:
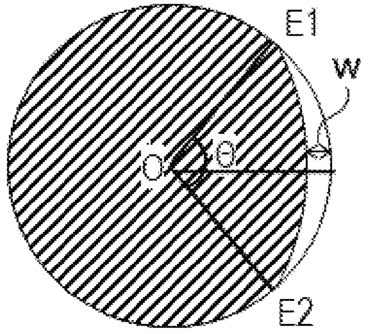
FIG. 9A illustrates an example of a pattern of a mold release region in a fine structure forming surface.
Figure 9E:
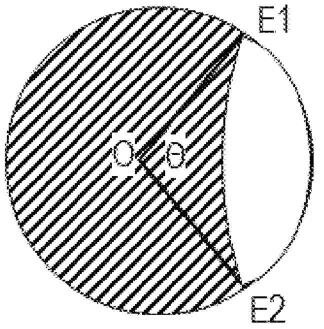
FIG. 9E illustrates an example of a pattern of the mold release region in the fine structure forming surface.
Figure 9B:
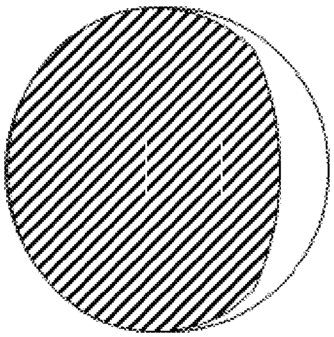
FIG. 9B illustrates an example of a pattern of the mold release region in the fine structure forming surface.
Figure 9F:
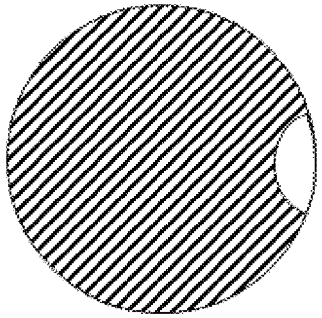
FIG. 9F illustrates an example of a pattern of the mold release region in the fine structure forming surface.
Figure 9C:
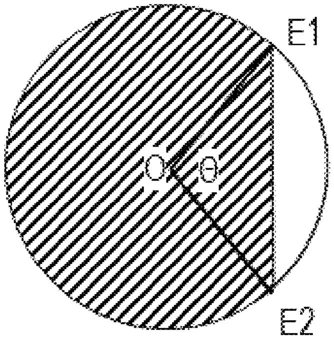
FIG. 9C illustrates an example of a pattern of the mold release region in the fine structure forming surface.
Figure 9G:
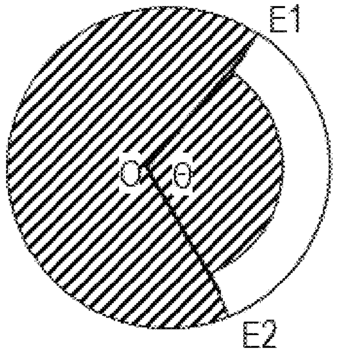
FIG. 9G illustrates an example of a pattern of the mold release region in the fine structure forming surface.
Figure 9D:
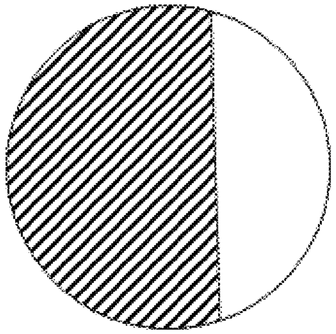
FIG. 9D illustrates an example of a pattern of the mold release region in the fine structure forming surface.
Figure 9H:
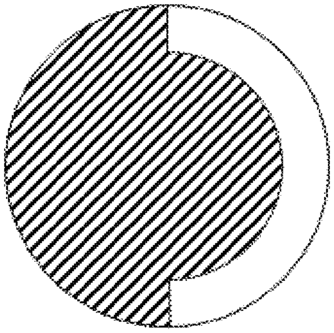
FIG. 9H illustrates an example of a pattern of the mold release region in the fine structure forming surface.

When end portions are determined to be two points on the outer edge of the fine structure forming surface, the mold release region can be provided between a first end portion and a second end portion. Examples of the mold release region are illustrated in FIG. 9A to FIG. 9H. When θ represents an angle that is formed by a first straight line (O-E1) which connects the first end portion (E1) and a geometric center (O) of the fine structure forming surface and a second straight line (O-E2) which connects the second end portion (E2) and the geometric center (O) of the fine structure forming surface, the θ can be set as 5 degrees≤θ≤150 degrees. This applies to FIG. 9A, FIG. 9C, FIG. 9E and FIG. 9G. In addition, the width of the fine structure forming surface in the radial direction can be smallest at the first end portion (E1) and the second end portion (E2), and be largest in the middle along the edge. This corresponds to FIG. 9A to FIG. 9F. Crescent shapes as illustrated in FIG. 9A and FIG. 9B are preferable examples. On the other hand, as illustrated in FIG. 9G and FIG. 9H, the widths may be set to the same at the first end portion (E1), the second end portion (E2), and the center along the edge.

In addition, when a diameter of the fine structure forming surface is represented by φ, and the maximum width of the mold release region in the direction of the diameter of the fine structure forming surface is represented by w, 4%≤w/φ≤10% can be satisfied. In addition, 0.26 mm≤w≤0.60 mm can be satisfied.

In the manufacturing method of the present disclosure, in the releasing, firstly, a force for separating the mold release region and the optical element can be applied. The force for separation is not limited, and examples thereof include use of an ejector pin, manual peeling, and separation using a tool.

In the method for manufacturing the optical element according to the present disclosure, the mold release resistance is reduced due to a region to be released prior to the fine structure forming region, which is provided in at least a part of the outer edge portion of the mold having the fine structure on the surface, and the fine structure is prevented from being destroyed at the time of mold release.

A first embodiment of a mold to be used in the method for manufacturing an optical element of the present disclosure will be described with reference to FIG. 1A to FIG. 1E.

In the first embodiment, the mold release region is formed of a flat region at the outermost edge of the fine structure forming surface and an intermediate region between the flat region and the fine structure forming region.

Figure 1B:
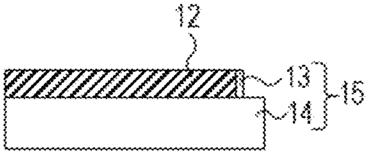
FIG. 1B illustrates a schematic cross-sectional view of the mold used in the first Example of the present disclosure.

FIG. 1A is a schematic view of the mold surface, and FIG. 1B is a schematic cross-sectional view taken along B1-B1 of FIG. 1A. In FIG. 1A, a mold 11 has a fine structure forming region 12 and a mold release region 15 on the surface, and the mold release region 15 is formed of an intermediate region 13 and a flat region 14. A surface roughness (R1) of the intermediate region 13 is larger than a surface roughness (R0) of the flat region 14, and is smaller than a surface roughness (R2) of the fine structure forming region 12. In other words, R0<R1<R2 is satisfied.

Figure 1C:
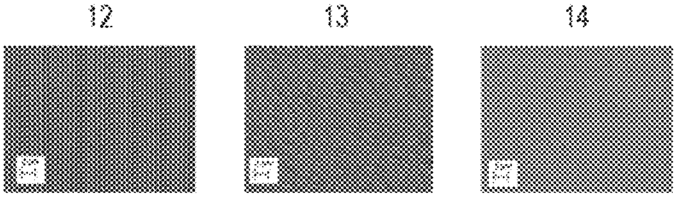
FIG. 1C illustrates SEM observation results of SEM observation of a fine structure forming region, an intermediate region and a flat region.

FIG. 1C illustrates SEM observation results of the fine structure forming region 12, the intermediate region 13, and the flat region 14. The intermediate region 13 illustrated in this figure is formed by collapsing a portion corresponding to the intermediate region of a photoresist film, when the mold is formed, and then reflecting the collapsed shape onto the $SiO_2$ film when ion milling is performed, as will be described later.

Next, a second embodiment of a mold which is used in a method for manufacturing an optical element of the present disclosure will be described with reference to FIG. 2A to FIG. 2E. In a second embodiment, the mold release region is formed of only the flat region, and the reference plane of the flat region is lower than the surface of the recessed portion of the fine structure forming region.

Figure 2A:
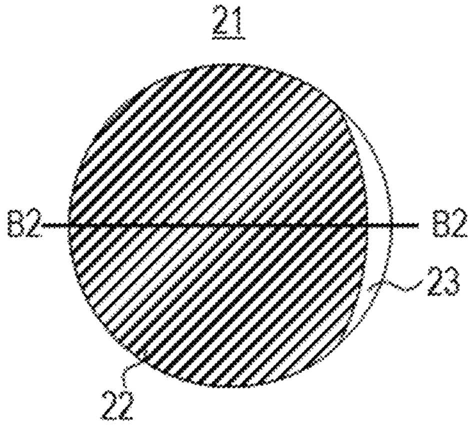
FIG. 2A illustrates a schematic view of a mold used in a second Example of the present disclosure.
Figure 2B:
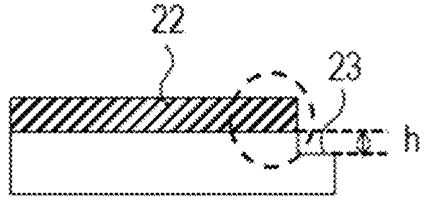
FIG. 2B illustrates a schematic cross-sectional view of the mold used in the second Example of the present disclosure.

FIG. 2A is a schematic view of the mold surface, and FIG. 2B is a schematic cross-sectional view taken along B2-B2 of FIG. 2A. In FIG. 2A, a mold 21 has a fine structure forming region 22 and a flat region 23, on its surface. In other words, in the present embodiment, the mold release region corresponds to the flat region 23.

Figure 2C:
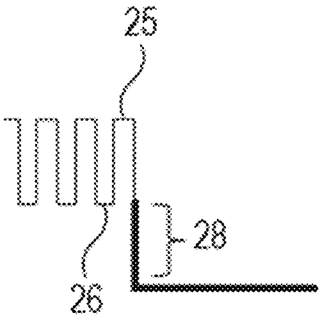
FIG. 2C illustrates an enlarged view of a cross section of the mold used in the second Example of the present disclosure.

FIG. 2C is an enlarged view of a portion surrounded by a dotted line in FIG. 2B. As can be understood from FIG. 2C, the flat region 23 is positioned at a position lower than the surface of the recessed portion 26 of the fine structure forming region 22, and a step 28 is formed. The SEM observation results of the fine structure forming region 22 and the flat region 23 are the same as those of the first embodiment, and accordingly will be omitted.

Next, a method for manufacturing an optical element of the present disclosure will be described with reference to process cross-sectional views according to the method for manufacturing an optical element illustrated in FIG. 3A to FIG. 3D. In the following description, the first embodiment will be taken as an example, but an optical element of the second embodiment can also be manufactured by a similar manufacturing method.

Figure 3A:
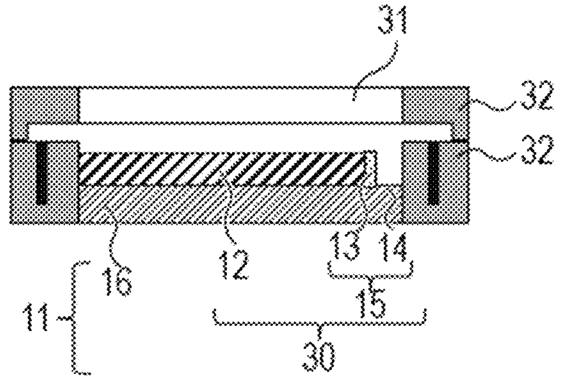
FIG. 3A illustrates a schematic cross-sectional view of a method for manufacturing an optical element according to Example of the present disclosure.

In an example of FIG. 3A, the mold is formed of a mold 31, a mold 11 and a mold frame 32. In FIG. 3A to FIG. 3D, the mold 11 includes a fine structure forming surface 30 and a base portion 16. For information, there is a case where a molding face of the mold 31 is referred to as a first face, and a molding face of the mold 11 is referred to as a second face. The second face includes the fine structure forming surface 30 and has a mold release region 15. Firstly, the mold 31 and the mold 11 are assembled to the mold frame 32, and then the resultant is installed in an unillustrated injection molding apparatus.

Figure 3B:
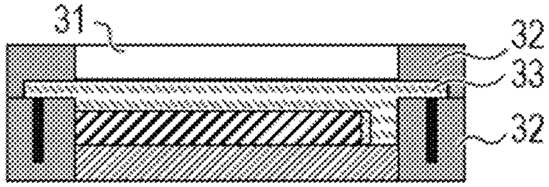
FIG. 3B illustrates a schematic cross-sectional view of the method for manufacturing the optical element according to Example of the present disclosure.

Next, as illustrated in FIG. 3B, the mold 31, the mold 11 and the mold frame 32 are heated to a predetermined temperature by an unillustrated heater, and then filled with a molten resin 33. The present figure illustrates an example in which the resin 33 is injected from a direction of the paper surface, and a gate portion is not illustrated. After filling, the resin 33 is cured (optical element forming step).

Figure 3C:
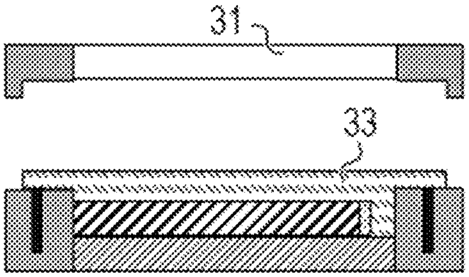
FIG. 3C illustrates a schematic cross-sectional view of the method for manufacturing the optical element according to Example of the present disclosure.
Figure 3D:
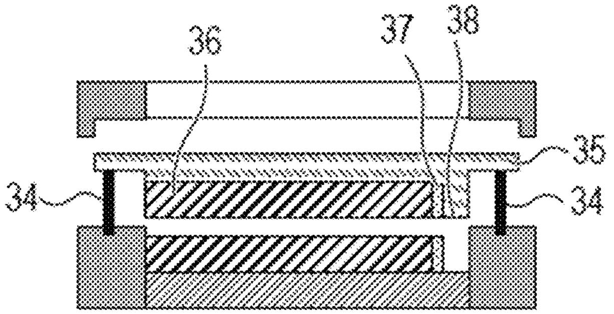
FIG. 3D illustrates a schematic cross-sectional view of the method for manufacturing the optical element according to Example of the present disclosure.

Next, as illustrated in FIG. 3C, the resin 33 is released from the mold 31. Here, the fine structure is not formed on the surface of the mold 31, and accordingly, the resin 33 can be released by a general method. Then, as illustrated in FIG. 3D, the resin 33 is released from the mold 11 with the use of ejector pins 34 (mold releasing step).

The flat region 14 has a smaller surface area than the fine structure forming region 12, and accordingly, a force required for mold release is small, and even in the case where the whole resin 33 is uniformly pressed by the ejector pins, the flat region 14 is released prior to the fine structure forming region 12. Because of this, air is introduced from the flat region 14 into the gap between the fine structure forming region 12 and the resin 33, which can prevent a space between the fine structure forming region 12 and the resin 33 from becoming a negative pressure. In this way, the mold release resistance of the fine structure forming region 12 can be reduced, which can prevent the fine structure from being destroyed.

In addition, as a further aspect, the present disclosure provides: an optical element having a fine structured surface on which the fine structure is formed which has been manufactured by the above method for manufacturing the optical element; and a lens formed of the optical element.

As a further aspect, the present disclosure provides an image forming apparatus that includes: a photosensitive member; a light source that emits a light beam; an exposure unit that scans and irradiates the photosensitive member with the light beam and thereby forms an electrostatic latent image; a developing unit that develops the electrostatic latent image formed on the photosensitive member and forms a toner image; and the above optical element provided between the light source and the photosensitive member. In such an image forming apparatus, the optical element is installed in order to form an image of light emitted from the light source, on the photosensitive member as, for example, an erect image of the same magnification.

As a further aspect, the present disclosure provides optical equipment that has a housing and an optical system which is arranged in the housing, wherein the optical system includes an image forming apparatus having the above optical element. Examples of such optical equipment include: an electrophotographic copying machine (for example, a digital copying machine) that forms a full-color image on a recording medium by using an electrophotographic method; an electrophotographic printer (for example, a color laser beam printer or a color LED printer); an MFP (multifunction peripheral); a facsimile apparatus; and a printing machine.

As a further aspect, the present disclosure provides an imaging device that includes a housing, an optical system which is arranged in the housing, and an imaging element which receives light having passed through the optical system, wherein the optical system includes the above optical element. Examples of the imaging device include a camera, a smartphone and a compact digital camera. In the camera, examples of the optical system include an interchangeable lens.

In addition, as a further aspect, the present disclosure provides an optical element having a fine structured surface, wherein the fine structured surface has a fine structure forming region and a region for mold release of at least a part of an outer edge; and a surface roughness of the region for the mold release is smaller than a surface roughness of the fine structure forming region.

In the fine structure forming region, the fine structure can be a periodic structure, the periodic structure can have a period of 1000 nm or smaller, and an aspect ratio of 0.8 or larger. More preferably, the period is 400 nm or smaller. Furthermore, the optical element has such a feature as to be capable of being provided at low cost. An optical element having a fine structure with such a period cannot be produced by a method using a mold, because the mold release is difficult, and when the optical element is manufactured by a method of separately forming the optical element and the fine structure, the processing cost is increased as a result in some cases.

The present invention will be described in more detail below with reference to Examples.

Example 1

Firstly, a mold that has been used in the present Example will be described with reference to FIG. 1A to FIG. 1C. FIG. 1A is a schematic view of the mold surface, and FIG. 1B is a schematic cross-sectional view taken along B1-B1 of FIG. 1A. In the present Example, the mold 11 was used that had a circular fine structure forming surface of which the diameter φ was 6 mm. As illustrated in FIG. 1A, the fine structure forming surface of the mold 11 is formed of a fine structure forming region 12, and a mold release region 15 which is formed of a flat region 14 and an intermediate region 13. A surface roughness (R1) of the intermediate region 13 is larger than a surface roughness (R0) of the flat region 14, and is smaller than a surface roughness (R2) of the fine structure forming region 12. FIG. 1C illustrates SEM observation results of the fine structure forming region 12, the intermediate region 13, and the flat region 14. As is understood from FIG. 1C, the fine structured body by which desired optical characteristics are obtained is formed in the fine structure forming region 12, and the fine structured body is not formed in the flat region 14. Furthermore, in the intermediate region 13, the fine structured body is formed of which the height of the structured body is lower than the height of the fine structure forming region 12. In the present Example, a nickel alloy was used as materials of the fine structure forming region 12, the intermediate region 13 and the flat region 14. In addition, the fine structured body in the fine structure forming region 12 was set so as to be a lattice structure of which the height was 600 nm, the period was 600 nm, and the width was 300 nm; and a surface roughness of the intermediate region 13 was set to a range of 30 to 100 nm by Ra. The flat region 14 was mirror-finished, and the surface roughness was 5 nm by Ra.

Figure 1D:
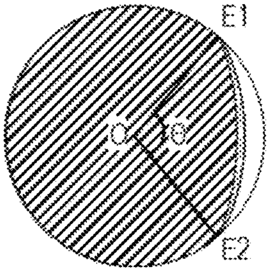
FIG. 1D illustrates a schematic view of the mold used in the first Example of the present disclosure.
Figure 1E:
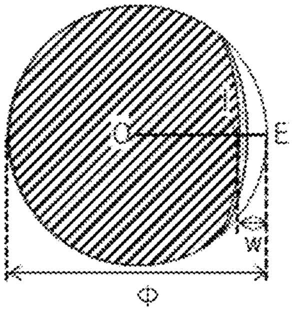
FIG. 1E illustrates a schematic view of the mold used in the first Example of the present disclosure.

The dimensions of the mold release region 15, the intermediate region 13 and the flat region 14 of the present Example will be described with reference to FIG. 1D and FIG. 1E. As illustrated in FIG. 1D, in the present Example, the first end portion (E1) and the second end portion (E2) of the outer edge of the fine structure forming surface were set at points E1 and E2, respectively, which were two points on a boundary between the mold release region 15 and the fine structure forming region 12, and in which the distance between the two points became maximum. An angle θ was defined to be an angle formed by the straight line E1-O and the straight line E2-O, when a geometric center of the surface of the mold 11 was defined as O. In the present Example, θ was set to 60 degrees. In addition, as illustrated in FIG. 1E, in the present Example, the maximum width w of the fine structure forming surface in the radial direction was defined as the maximum length w of a straight line E-I, when I represented an intersection point between a straight line E-O which connected the point E at the end portion of the mold and O and a boundary between either the intermediate region 13 or the flat region 14 and the fine structure forming region 12. In the present Example, w was set to 0.35 mm.

Next, a method for manufacturing the optical element in the present Example will be described with reference to FIG. 3A to FIG. 3E.

Firstly, as illustrated in FIG. 3A, the mold 31 and the mold 11 were assembled to the mold frame 32, and then the resultant was installed in the unillustrated injection molding apparatus. Here, the molding face of the mold 31 shall be referred to as the first face, and the molding face of the mold 11 shall be referred to as the second face. The second face includes the fine structure forming surface, and the fine structure forming surface 30 has the fine structure forming region 12 and the mold release region 15 which is formed of the intermediate region 13 and the flat region 14. In addition, the mold 31 had a cylindrical shape with φ of 6 mm, similarly to the mold 11, but the first face was not provided with the fine structure forming surface, and was mirror-finished as was generally used for optical faces; and the surface roughness was set to approximately 5 nm by Ra.

Next, as illustrated in FIG. 3B, the mold 31, the mold 11 and the mold frame 32 were heated to a predetermined temperature by an unillustrated heater, and then filled with a molten resin 33. In the present Example, a cycloolefin polymer resin (COP: Tg=140° C.) was used as the resin 33. In addition, the temperatures of the mold 31, the mold 11 and the mold frame 32 were each set to 135° C., the melting temperature of the resin 33 was set to 270° C., and the filling pressure was set to 100 MPa. The resin 33 was injected from the direction of the paper surface, and accordingly, the gate portion was not illustrated.

Next, after the temperature of the injected resin 33 became the Tg temperature or lower, the resin 33 was released from the mold 31 as illustrated in FIG. 3C. Here, the fine structure was not formed on the surface of the mold 31, and accordingly, the resin 33 was released by a general method.

Next, as illustrated in FIG. 3D, the resin 33 was released from the mold 11 with the use of the ejector pins 34, and thereby a molded article 35 was obtained. Here, the flat region 14 has a smaller surface area than the fine structure forming region 12, and accordingly, a force required for mold release is small, and even in the case where the whole resin 33 is uniformly pressed by the ejector pins, the flat region 14 is released prior to the fine structure forming region 12. Because of this, air is introduced from a flat region 14 side into the gap between the fine structure forming region 12 and the resin 33, and a space between the fine structure forming region 12 and the resin 33 does not become a negative pressure. In this way, the mold release resistance of the fine structure forming region 12 was reduced, which could prevent the fine structure from being destroyed. The fine structure forming region 12 is sequentially released from the flat region 14 side. At this time, if the flat region 14 and the fine structure forming region 12 are in direct contact with each other, the mold release force changes rapidly at the boundary therebetween; and accordingly, there is a concern that the fine structure will be destroyed as a result, and the concern becomes particularly remarkable in a structured body having a high aspect ratio. In the present Example, the mold release region 15 had the intermediate region 13, and thereby, a rapid change for the mold release force could be alleviated; and accordingly, even in a fine structure having the high aspect ratio, the destruction could be prevented.

Figure 3E:
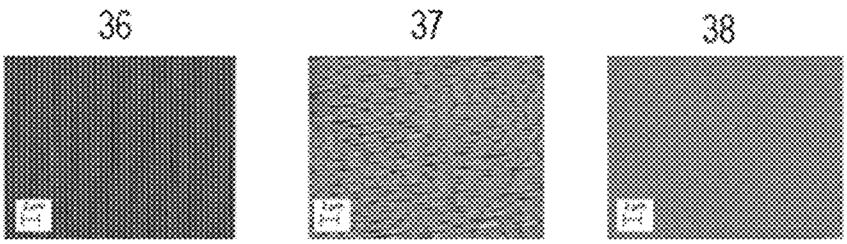
FIG. 3E illustrates SEM observation results of a molded article obtained in Example.

FIG. 3E illustrates SEM observation results of the molded article 35 obtained in the present Example. On the surface of the molded article 35, regions transferred from the fine structure forming region 12, the intermediate region 13 and the flat region 14 were formed as a fine structure forming region 36, an intermediate region 37 and a flat region 38, respectively.

In the present Example, the cycloolefin polymer resin (COP) was used as the molding resin, but any material may be used as long as the material has a transmittance of 90% or larger at the wavelength of light to be used and can be injection-molded. Usable resins in the visible light wavelength region include a polystyrene resin (PS), an acrylic resin such as a polymethyl methacrylate resin (PMMA), and a polycarbonate resin (PC), in addition to the cycloolefin polymer resin (COP).

Next, a method of forming the mold 11 which has been used in the present Example will be described with reference to process cross-sectional views illustrated in FIG. 4A to FIG. 4F.

Figure 4A:
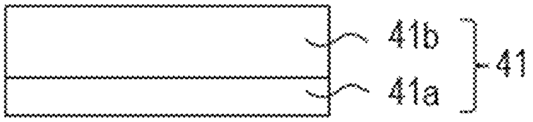
FIG. 4A illustrates a schematic cross-sectional view illustrating a method for manufacturing a mold used in a first Example of the present disclosure.

Firstly, as illustrated in FIG. 4A, an injection molding mold 41 was prepared. The injection molding mold 41 was formed of a base portion 41*a* made from stainless steel and a mirror surface portion 41*b* made from a nickel alloy.

Figure 4B:
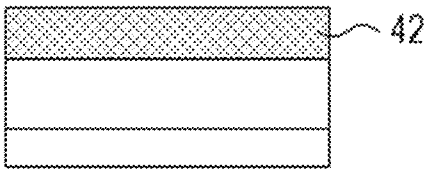
FIG. 4B illustrates a schematic cross-sectional view illustrating the method for manufacturing the mold used in the first Example of the present disclosure.

Next, as illustrated in FIG. 4B, a photoresist layer 42 was formed by a spin coating method. The spin coating condition in the present Example was set to 3000 rpm/20 seconds, and the film thickness of the photoresist layer was approximately 200 nm.

Figure 4C:
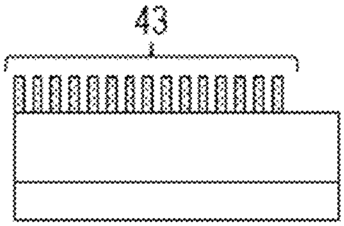
FIG. 4C illustrates a schematic cross-sectional view illustrating the method for manufacturing the mold used in the first Example of the present disclosure.

Next, as illustrated in FIG. 4C, the photoresist layer was exposed to light by an interferometric exposure method and then was developed; and thereby, a photoresist pattern 43 was obtained. The photoresist pattern 43 was formed into a lattice structure of which the period was 600 nm and the width was 300 nm.

Figure 4D:
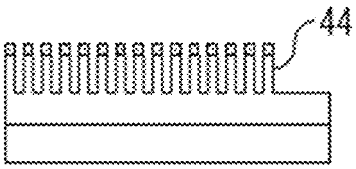
FIG. 4D illustrates a schematic cross-sectional view illustrating the method for manufacturing the mold used in the first Example of the present disclosure.

Next, as illustrated in FIG. 4D, the shape of the photoresist pattern 43 was copied to the mirror surface portion 41*b* made from the nickel alloy, with the use of an ion milling method using Ar gas, and thereby, a fine structure 44 was obtained. The height of the fine structure 44 was controlled to 600 nm.

Figure 4E:
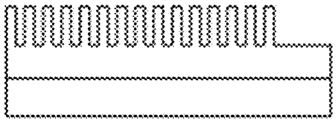
FIG. 4E illustrates a schematic cross-sectional view illustrating the method for manufacturing the mold used in the first Example of the present disclosure.

Next, as illustrated in FIG. 4E, the residue of the photoresist pattern 43 was removed by an oxygen-ashing method.

Figure 4F:
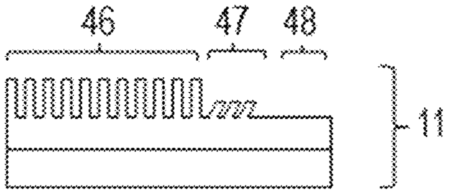
FIG. 4F illustrates a schematic cross-sectional view illustrating the method for manufacturing the mold used in the first Example of the present disclosure.
Figure 10A:
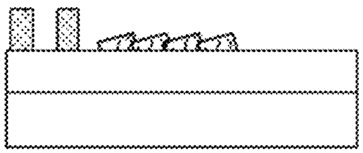
FIG. 10A illustrates a schematic cross-sectional view illustrating another example of a method for manufacturing a mold in the present disclosure.
Figure 10B:
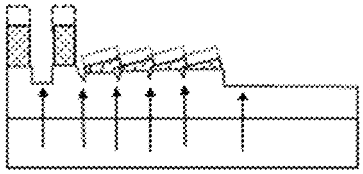
FIG. 10B illustrates a schematic cross-sectional view illustrating another example of a method for manufacturing a mold in the present disclosure.
Figure 10C:
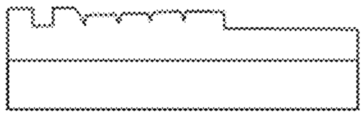
FIG. 10C illustrates a schematic cross-sectional view illustrating another example of a method for manufacturing a mold in the present disclosure.

Next, as illustrated in FIG. 4F, the fine structure of a fine structure forming region 46 in contact with a flat region 48 was collapsed, and thereby, an intermediate region 47 was formed; and the mold 11 was obtained. For information, in the present Example, the intermediate region has been formed by collapsing the formed fine structure, but the intermediate region can also be formed by collapsing a photoresist film. This example will be described with reference to FIG. 10A to FIG. 10C. Specifically, after the photoresist layer is formed, a part of the photoresist layer is collapsed as illustrated in FIG. 10A, and then, the collapsed shape is reflected on an $SiO_2$ film when ion milling is performed, as illustrated in FIG. 10B. In FIG. 10B, the dotted line indicates the photoresist film removed by the ion milling, and the arrow indicates the shape of the $SiO_2$ film removed by the ion milling. The photoresist residue is removed, and the intermediate region as illustrated in FIG. 10C is formed.

Example 2

Firstly, a mold that has been used in the present Example will be described with reference to FIG. 2A and FIG. 2B. FIG. 2A is a schematic view of the mold surface, and FIG. 2B is a schematic cross-sectional view taken along B2-B2 of FIG. 2A. In the present Example, a mold 21 was used which had a circular fine structured surface with a diameter φ of 6.5 mm. As illustrated in FIG. 2A, the mold 21 had a fine structure forming region 22 and a flat region 23, on its surface. The mold 21 did not have the intermediate region. In the present Example, the fine structure forming region 22 employed silicon dioxide as its material, and the flat region 14 employed titanium as its material. In addition, the fine structured body of the fine structure forming region 12 was formed into the lattice structure of which the height was 1000 nm, the period was 800 nm, and the width was 500 nm. The flat region 23 was mirror-finished, and its surface roughness was 9 nm by Ra.

Figure 2D:
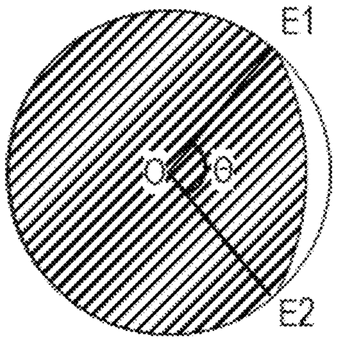
FIG. 2D illustrates a schematic view of the mold used in the second Example of the present disclosure.
Figure 2E:
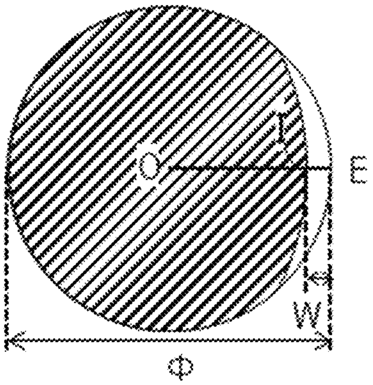
FIG. 2E illustrates a schematic view of the mold used in the second Example of the present disclosure.

The dimensions of the flat region 23 of the present Example will be described below. As illustrated in FIG. 2D, θ was determined to be the same as in Example 1, and in the present Example, θ was set to 60 degrees. As illustrated in FIG. 2E, in the present Example, w was set to 0.26 mm. In addition, as illustrated in FIG. 2B, a difference h between the reference plane of the mold release region and a surface of the recessed portion of the fine structure forming region was expressed by h=100 nm in the present Example, where h represented the height of the step which was formed by the surface of the flat region 23 and the surface of the recessed portion 24 of the fine structure forming region 22.

Next, a method for manufacturing an optical element according to the present Example will be described. The manufacturing method of the present Example used injection molding as in Example 1. However, because a polymethyl methacrylate resin (PMMA: Tg=70° C.) was used as the molding resin, the manufacturing conditions were set so that the mold temperature was 65° C., the melting temperature was 210° C., and the filling pressure was 80 MPa.

In the present Example, as in Example 1, the mold release resistance of the fine structure forming region 22 was reduced, which could prevent the fine structure from being damaged at the time of the mold release. Furthermore, because the flat region was formed at a position lower than the surface of the recessed portion 24 of the fine structure forming region 22, the rapid change of the mold release force did not directly affect the fine structure; and even in the fine structure having the high aspect ratio, the destruction could be prevented.

Next, a method of forming the mold 21 which has been used in the present Example will be described with reference to process cross-sectional views illustrated in FIG. 5A to FIG. 5H.

Figure 5A:
FIG. 5A illustrates a schematic cross-sectional view illustrating a method for manufacturing a mold used in a second Example of the present disclosure.

Firstly, as illustrated in FIG. 5A, an injection molding mold 51 was prepared. The injection molding mold 51 was formed of a base portion 51*a* made from stainless steel and a mirror surface portion 51*b* made from a nickel alloy.

Figure 5B:
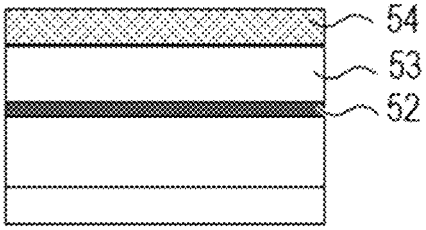
FIG. 5B illustrates a schematic cross-sectional view illustrating the method for manufacturing the mold used in the second Example of the present disclosure.

Next, as illustrated in FIG. 5B, a Ti film 52 and an $SiO_2$ film 53 were formed by a sputtering method, and then, a photoresist layer 54 was formed by a spin coating method. The sputtering conditions in the present Example were as follows. In addition, the film thickness of the Ti film was controlled to 50 nm, and the film thickness of the $SiO_2$ was controlled to 1100 nm.

Ti film forming conditions
Ar gas: 10 sccm
Pressure: 0.5 Pa
DC power: 400 W, film forming time: 2 minutes
$SiO_2$ film forming conditions
Ar gas: 8 sccm
$O_2$ gas: 2 sccm
Pressure: 0.5 Pa
RF power: 400 W, film forming time: 8 hours In addition, the spin coating condition in the present Example was set to 3000 rpm/20 seconds, and the film thickness of the photoresist layer was approximately 200 nm.

Figure 5C:
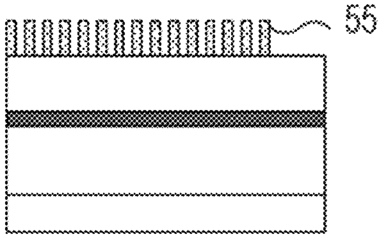
FIG. 5C illustrates a schematic cross-sectional view illustrating the method for manufacturing the mold used in the second Example of the present disclosure.

Next, as illustrated in FIG. 5C, the photoresist layer was exposed to light by an interferometric exposure method and then was developed; and thereby, a photoresist pattern 55 was obtained. The photoresist pattern 55 was formed into a lattice structure of which the period was 800 nm and the width was 500 nm.

Figure 5D:
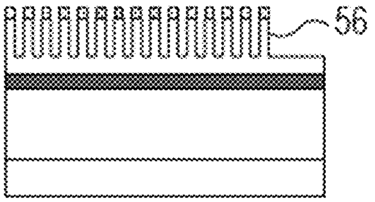
FIG. 5D illustrates a schematic cross-sectional view illustrating the method for manufacturing the mold used in the second Example of the present disclosure.

Next, as illustrated in FIG. 5D, the shape of the photoresist pattern 55 was copied onto the $SiO_2$ film 53 with the use of a dry etching method using $CHF_3$ gas, and thereby, a fine structure 56 was obtained. The height of the fine structure 56 was 1000 nm.

Figure 5E:
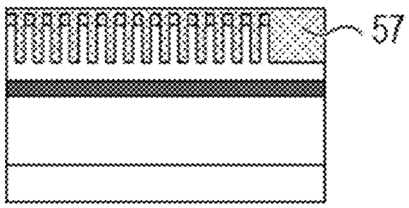
FIG. 5E illustrates a schematic cross-sectional view illustrating the method for manufacturing the mold used in the second Example of the present disclosure.

Next, as illustrated in FIG. 5E, a photoresist layer 57 was formed by a spin coating method.

Figure 5F:
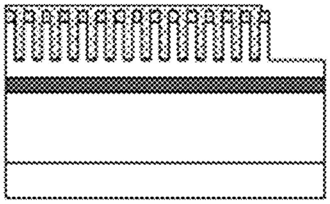
FIG. 5F illustrates a schematic cross-sectional view illustrating the method for manufacturing the mold used in the second Example of the present disclosure.

Next, as illustrated in FIG. 5F, only the photoresist layer 57 in the flat region was removed by exposure and developing.

Figure 5G:
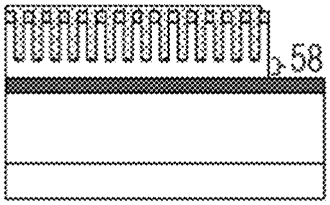
FIG. 5G illustrates a schematic cross-sectional view illustrating the method for manufacturing the mold used in the second Example of the present disclosure.

Next, as illustrated in FIG. 5G, the $SiO_2$ film in the flat region was removed with the use of the dry etching method using $CHF_3$ gas, and thereby, a step 58 was formed in between the flat region and the surface of the recessed portion of the fine structure.

Figure 5H:
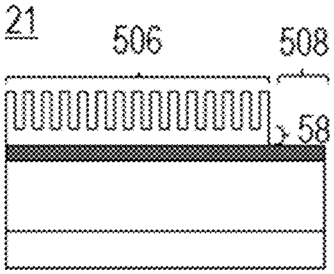
FIG. 5H illustrates a schematic cross-sectional view illustrating the method for manufacturing the mold used in the second Example of the present disclosure.

Next, as illustrated in FIG. 5H, the residues of the photoresist pattern 55 and the photoresist layer 57 were removed by an oxygen-ashing method, and thereby, the mold 21 was obtained. Reference numeral 506 denotes the fine structure forming region, and 508 denotes the flat region.

Example 3

Figure 6A:
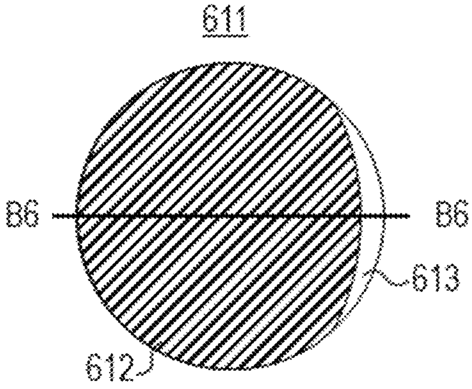
FIG. 6A illustrates a schematic view of a mold surface used in Example of the present disclosure.
Figure 6B:
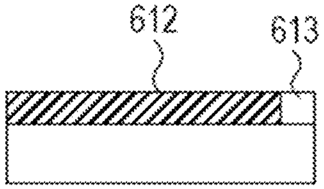
FIG. 6B illustrates a cross-sectional schematic view of the mold used in Example of the present disclosure.

Firstly, a mold that has been used in Example will be described with reference to FIG. 6A and FIG. 6B. FIG. 6A is a schematic view of the mold surface, and FIG. 6B is a schematic cross-sectional view taken along B6-B6 of FIG. 6A. In the present Example, the mold 611 was used that had a circular fine structured surface of which the diameter φ was 10 mm. As illustrated in FIG. 6A, the mold 611 had a fine structure forming region 612 and a flat region 613 on its surface. The mold 611 did not have the intermediate region. In the present Example, a nickel alloy was used as materials of the fine structure forming region 612 and the flat region 613. In addition, the fine structured body of the fine structure forming region 612 was formed into the cylindrical structure of which the height was 200 nm, the period was 250 nm, and the width was 300 nm. The flat region 613 was mirror-finished, and its surface roughness was 1 nm by Ra.

The dimensions of the flat region 613 of the present Example will be described below. The definition of each dimension is the same as in Examples 1 and 2, and accordingly will be omitted. In the present Example, the dimensions were set as θ=5 degrees, and w=0.1 mm.

Next, a method for manufacturing an optical element according to the present Example will be described. The manufacturing method of the present Example used the injection molding as in Example 1. However, because a polycarbonate resin (PC: Tg=155° C.) was used as a molding resin, the manufacturing conditions were set so that the mold temperature was 150° C., the melting temperature was 290° C., and the filling pressure was 120 MPa.

In the present Example, as in Example 1, the mold release resistance of the fine structure forming region 612 was reduced, which could prevent the fine structure from being damaged at the time of the mold release. On the surface of the mold 611 used in the present Example, the intermediate region and the step at the boundary between the flat region 613 and the fine structure forming region were not formed, but the destruction of the fine structure was not confirmed because the aspect ratio of the fine structured body was low.

Example 4

The mold used in the present Example had the fine structure forming region and the flat region on its surface, and did not have the intermediate region, as in Example 2. The mold had a step between the reference plane of the flat region and the surface of the recessed portion of the fine structure forming region.

In the present Example, silicon dioxide was used as a material of the fine structure forming region, and a nickel alloy was used as a material of the flat region. In addition, the fine structured body of the fine structure forming region was set to be a cylindrical structure of which the height was 715 nm, the period was 700 nm, and the width was 500 nm. The flat region 623 was mirror-finished, and its surface roughness was 9 nm by Ra.

The dimensions of the flat region in the present Example were θ=150 degrees, w=0.6 mm, and h=2500 nm.

Next, a method for manufacturing an optical element in the present Example will be described. In the present Example, the injection molding was used as in the method of manufacturing the optical element described in Example 1. Because a polystyrene resin (PS: Tg=100° C.) was used as a molding resin, the manufacturing conditions were set so that the mold temperature was 95° C., the melting temperature was 230° C., and the filling pressure was 100 MPa.

In the present Example, as in Example 2, the mold release resistance of the fine structure forming region 612 was reduced, which could prevent the fine structure from being damaged at the time of the mold release.

Example 5

Figure 6C:
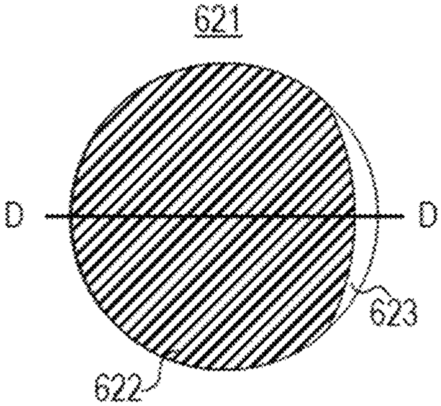
FIG. 6C illustrates a schematic view of a mold used in Example of the present disclosure.
Figure 6D:
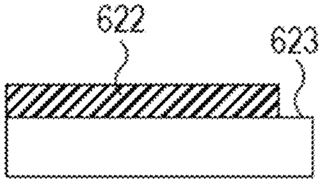
FIG. 6D illustrates a cross-sectional schematic view of the mold used in Example of the present disclosure.

Firstly, a mold according to the present Example will be described with reference to FIG. 6C and FIG. 6D. FIG. 6C is a schematic view of a mold surface, and FIG. 6D is a schematic cross-sectional view taken along D-D of FIG. 6C. In the present Example, the mold 621 was used that had a circular fine structured surface of which the diameter φ was 20 mm. As illustrated in FIG. 6C, the mold 621 had a fine structure forming region 622 and a flat region 623 on its surface. The mold 621 did not have the intermediate region. In the present Example, the fine structure forming region 622 employed $SiO_2$ as its material, and the flat region 623 employed titanium as its material. In addition, the fine structured body of the fine structure forming region 622 was formed into a moth-eye structure of which the height was 300 nm and the period was 200 nm. The flat region 623 was mirror-finished, and its surface roughness was 5 nm by Ra.

In the present Example, the dimensions were set as θ=30 degrees, and w=0.1 mm.

Next, a method for manufacturing the optical element in the present Example will be described. In the present Example, as the manufacturing method and the molding resin, the injection molding and the cycloolefin polymer resin (COP) were used as in the method of manufacturing the optical element described in Example 1.

In the present Example, as in Example 1, the mold release resistance of the fine structure forming region 622 was reduced, which could prevent the fine structure from being destroyed at the time of the mold release.

Example 6

Figure 6E:
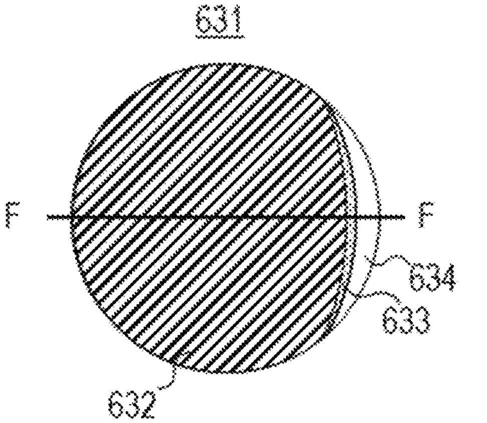
FIG. 6E illustrates a schematic view of a mold used in Example of the present disclosure.
Figure 6F:
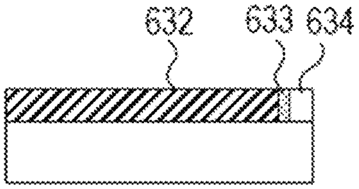
FIG. 6F illustrates a cross-sectional schematic view of the mold used in Example of the present disclosure.

Firstly, a mold that has been used in the present Example will be described with reference to FIG. 6E and FIG. 6F. FIG. 6E is a schematic view of a mold surface, and FIG. 6F is a schematic cross-sectional view taken along F-F of FIG. 6E. In the present Example, the mold 631 was used that had a circular fine structure forming surface of which the diameter p was 7 mm. As illustrated in FIG. 6E, the mold 631 had a fine structure forming region 632, an intermediate region 633 and a flat region 634, on its surface. In the present Example, a nickel alloy was used as materials of the fine structure forming region 632, the intermediate region 633 and the flat region 634. In addition, the fine structured body in the fine structure forming region 632 was set so as to be a lattice structure of which the height was 200 nm, the period was 130 nm, and the width was 100 nm; and a surface roughness of the intermediate region 633 was set to a range of 20 to 30 nm by Ra. The flat region 634 was mirror-finished, and the surface roughness was 5 nm by Ra.

In the present Example, the dimensions were set as θ=100 degrees, and w=0.5 mm.

Next, the method for manufacturing an optical element will be described, which has been used in the present Example. As the method for manufacturing the optical element and the molding resin in the present Example, the injection molding and a polystyrene resin (PS) were used similarly to the method for manufacturing the optical element described in Example 4.

In the present Example, as in Example 1, the mold release resistance of the fine structure forming region 632 was reduced, which could prevent the fine structure from being destroyed at the time of the mold release.

Example 7

Figure 6G:
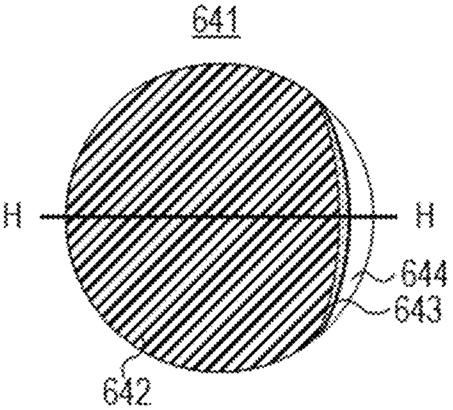
FIG. 6G illustrates a schematic view of a mold used in Example of the present disclosure.
Figure 6H:
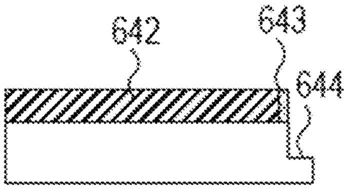
FIG. 6H illustrates a cross-sectional schematic view of the mold used in Example of the present disclosure.

Firstly, the mold that has been used in the present Example will be described with reference to FIG. 6G and FIG. 6H. FIG. 6G is a schematic view of a mold surface, and FIG. 6H is a schematic cross-sectional view taken along H-H of FIG. 6G. In the present Example, the mold 641 was used that had a circular fine structure forming surface of which the diameter y was 7 mm. As illustrated in FIG. 6G, the mold 641 had a fine structure forming region 642, an intermediate region 643 and a flat region 644, on its surface. In the present Example, the fine structure forming region 642 and the intermediate region 643 employed $SiO_2$ as their materials, and the flat region 644 employed titanium as its material. In addition, the fine structured body in the fine structure forming region 642 was set so as to be a lattice structure of which the height was 200 nm, the period was 130 nm, and the width was 100 nm; and a surface roughness of the intermediate region 643 was set to a range of 20 to 80 nm by Ra. The flat region 644 was mirror-finished, and the surface roughness was 5 nm by Ra.

In the present Example, the dimensions were set as θ=100 degrees, w=0.5 mm, and h=200 nm.

Next, a method for manufacturing the optical element of the present Example will be described. As the method for manufacturing an optical element and a molding resin in the present Example, the injection molding and a cycloolefin polymer resin (COP) were used similarly to the method of manufacturing the optical element described in Example 1.

In the present Example, as in Example 1, the mold release resistance of the fine structure forming region 622 was reduced, which could prevent the fine structure from being destroyed.

Comparative Example

Firstly, a mold that has been used in the present Comparative Example will be described with reference to FIG.

Figure 7A:
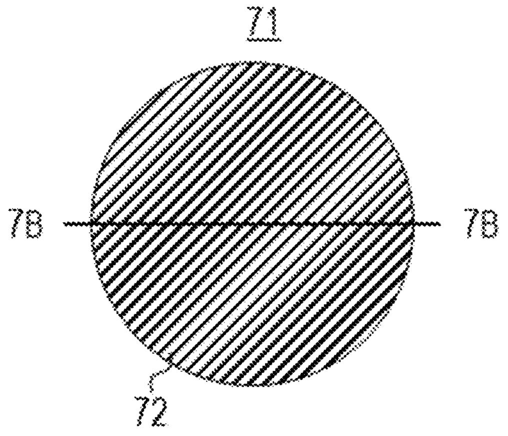
FIG. 7A illustrates a schematic view of a mold used in Comparative Example of the present disclosure.
Figure 7B:
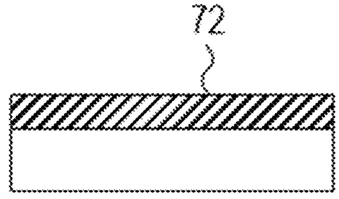
FIG. 7B illustrates a cross-sectional view of the mold used in Comparative Example of the present disclosure.

7A and FIG. 7B. FIG. 7A is a schematic view of the mold surface, and FIG. 7B is a schematic cross-sectional view taken along 7B-7B of FIG. 7A. In the present Comparative Example, a mold 71 was used that had a circular fine structure forming surface of which the diameter φ was 6 mm. However, as illustrated in FIG. 7A, only a fine structure forming region 72 was formed on the mold 71, and there was not the mold release region. In the present Comparative Example, a nickel alloy was used as a material of the fine structure forming region 72. In addition, the fine structured body of the fine structure forming region 72 was formed into the lattice structure of which the height was 600 nm, the period was 600 nm, and the width was 300 nm.

Next, a method for manufacturing the optical element of the present Comparative Example will be described. As the method for manufacturing the optical element and the molding resin in the present Comparative Example, the injection molding and a cycloolefin polymer resin (COP) were used similarly to the method for manufacturing the optical element described in Example 1.

In the present Comparative Example, the whole surface of the fine structure forming region 72 is released almost at the same time, and accordingly, a negative pressure is generated in the gap between the mold 71 and the molding resin. Because of this, the mold release resistance increased, and damage was confirmed in the fine structure.

Table 1 shows a summary of Examples and Comparative Examples.

TABLE 1

| | Flat region | | | | | Intermediate region | |
|---|---|---|---|---|---|---|---|
| | θ | w | h | Ra | Material | Ra | Material |
| Example 1 | 60 deg | 0.35 mm | — | 5 nm | Ni alloy | 30 nm-100 nm | Ni alloy |
| Example 2 | 60 deg | 0.26 mm | 100 nm | 9 nm | SiO2 | — | — |
| Example 3 | 5 deg | 0.1 mm | — | 1 nm | Ni alloy | — | — |
| Example 4 | 150 deg | 0.6 mm | 2500 nm | 9 nm | Ni alloy | — | — |
| Example 5 | 30 deg | 0.1 mm | — | 5 nm | Ti | — | — |
| Example 6 | 100 deg | 0.5 mm | — | 5 nm | Ni alloy | 20 nm-30 nm | Ni alloy |
| Example 7 | 100 deg | 0.5 mm | 200 nm | 5 nm | Ti | 20 nm-80 nm | SiO2 |
| Comparative Example 1 | | None | | | | | |

| | Fine structure | | | | | Molding resin |
|---|---|---|---|---|---|---|
| | Type | Height | Period | Width | Material | |
| Example 1 | Lattice structure | 600 nm | 600 nm | 300 nm | Ni alloy | COP |
| Example 2 | Lattice structure | 1000 nm | 800 nm | 500 nm | SiO2 | PMMA |
| Example 3 | Cylindrical structure | 200 nm | 250 nm | 300 nm | Ni alloy | PC |
| Example 4 | Cylindrical structure | 715 nm | 700 nm | 500 nm | SiO2 | PS |
| Example 5 | Moth eye | 300 nm | 200 nm | — | SiO2 | COP |
| Example 6 | Lattice structure | 200 nm | 130 nm | 100 nm | Ni alloy | PS |
| Example 7 | Lattice structure | 200 nm | 130 nm | 100 nm | SiO2 | COP |
| Comparative Example 1 | Lattice structure | 600 nm | 600 nm | 300 nm | Ni alloy | |

Effects of the Invention

According to the above units, the method for manufacturing an optical element is provided, which prevents or reduces the damage of the fine structure at the time of the mold release. In addition, an optical element manufactured by the method is also provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-187767, filed Nov. 1, 2023, which is hereby incorporated by reference herein in its entirety.

What is claimed is:

1. A method for manufacturing an optical element having a fine structured surface on which a fine structure is formed, by use of a mold having a fine structure forming surface, the method comprising:
forming the optical element by filling the mold with a curable composition, and curing the curable composition; and
releasing the optical element from the fine structure forming surface, wherein
the fine structure forming surface comprises a fine structure forming region and a mold release region;
the mold release region is provided on at least a part of an outer edge of the fine structure forming surface; and
a surface roughness of the mold release region is smaller than a surface roughness of the fine structure forming region.

2. The method according to claim 1, wherein a reference plane of the mold release region is lower than a surface of a recessed portion of the fine structure forming region, in at least a part of the mold release region.

3. The method according to claim 2, wherein
when the reference plane of the mold release region is lower than the surface of the recessed portion of the fine structure forming region by h, and
a height of the fine structure is represented by d,
a following expression is satisfied:

$$10\% \leq h/d \leq 350\%.$$

4. The method according to claim 2, wherein
the reference plane of the mold release region is lower than the surface of the recessed portion of the fine structure forming region by h, and
a following expression is satisfied:

$$100 \text{ nm} \leq h \leq 2500 \text{ nm}.$$

5. The method according to claim 1, wherein
the mold release region comprises a flat region at an outermost edge of the fine structure forming surface and an intermediate region between the flat region and the fine structure forming region, and
when a surface roughness of the flat region is represented by R0, a surface roughness of the intermediate region is represented by R1, and the surface roughness of the fine structure is represented by R2,
a following expression is satisfied:

$$R0 < R1 < R2.$$

6. The method according to claim 5, wherein
a following expression is satisfied:

$$R2 - R1 \geq 10 \text{ nm}.$$

7. The method according to claim 5, wherein
following expressions are satisfied:

$$R0 < 10 \text{ nm, and}$$

$$10 \text{ nm} \leq R1.$$

8. The method according to claim 1, wherein in the mold release region, the surface roughness gradually increases toward the outer edge of the fine structure forming surface.

9. The method according to claim 1, wherein in the releasing, firstly, a force for separating the mold release region and the optical element is applied.

10. The method according to claim 1, wherein when the mold release region is provided between a first end portion and a second end portion of the outer edge of the fine structure forming surface, and an angle formed by a first straight line connecting the first end portion and a geometric center of the fine structure forming surface and a second straight line connecting the second end portion and the geometric center of the fine structure forming surface is defined as θ,
a following expression is satisfied:

$$5 \text{ degrees} \leq \theta \leq 150 \text{ degrees}.$$

11. The method according to claim 10, wherein the mold release region has a shape in which a width of the mold release region in a direction of a diameter of the fine structure forming surface is smallest at the first end portion and the second end portion, and is largest in a middle along an edge.

12. The method according to claim 1, wherein
when a diameter of the fine structure forming surface is represented by φ, and a maximum width of the mold release region in a direction of the diameter of the fine structure forming surface is represented by w,
a following expression is satisfied:

$$4\% \leq w/\phi \leq 10\%.$$

13. The method according to claim 1, wherein
when a maximum width of the mold release region in a direction of the diameter of the fine structure forming surface is represented by w,
a following expression is satisfied:

$$0.26 \text{ mm} \leq w \leq 0.60 \text{ mm}.$$

14. The method according to claim 1, wherein the curable composition is a resin.

* * * * *